(12) United States Patent
Bran

(10) Patent No.: US 6,295,999 B1
(45) Date of Patent: Oct. 2, 2001

(54) WAFER CLEANING METHOD

(75) Inventor: Mario E. Bran, Garden Grove, CA (US)

(73) Assignee: Verteq, Inc., Santa Ana, CA (US)

( * ) Notice: Subject to any disclaimer, the term of this patent is extended or adjusted under 35 U.S.C. 154(b) by 0 days.

(21) Appl. No.: 09/643,328

(22) Filed: Aug. 22, 2000

Related U.S. Application Data

(63) Continuation of application No. 09/057,182, filed on Apr. 8, 1998, now Pat. No. 6,140,744, which is a continuation-in-part of application No. 08/724,518, filed on Sep. 30, 1996, now Pat. No. 6,039,059.

(51) Int. Cl.[7] .................................................. B08B 3/12
(52) U.S. Cl. ................................ 134/1.3; 134/1; 134/6; 134/7; 134/25.5; 134/2; 134/32; 134/34; 134/184; 134/199; 134/902
(58) Field of Search ................................ 134/1, 1.3, 6, 7, 134/2, 25.5, 32, 34, 105, 184, 199, 902

(56) References Cited

U.S. PATENT DOCUMENTS

| | | |
|---|---|---|
| 2,498,737 | 2/1950 | Holden . |
| 2,699,403 | 1/1955 | Courts . |
| 2,713,998 | 7/1955 | Eicken . |

(List continued on next page.)

FOREIGN PATENT DOCUMENTS

| | | |
|---|---|---|
| 3212-916-A | 10/1983 | (DE) . |
| 319-806-A | 6/1989 | (EP) . |
| 54-7874 | 1/1979 | (JP) . |
| 54-69260 | 4/1979 | (JP) . |
| 62-281431 | 12/1987 | (JP) . |
| 63-36534 | 2/1988 | (JP) . |
| 64-18229 | 1/1989 | (JP) . |
| 1-246935 | 10/1989 | (JP) . |
| 1-304733 | 12/1989 | (JP) . |
| 1-316935 | 12/1989 | (JP) . |

OTHER PUBLICATIONS

Stuart A. Hoenig: Cleaning Surfaces With Dry Ice: *Compressed Air Magazine*: Aug. 1986: pp. 22–25.

Va–Tran Systems, Inc.: *Sno Gun™ Dry Ice Snow Cleaning System for Electronic, Semi–Conductor, Medical, Optical and Other Diverse Industries* No date.

IBM Technical Disclosure Bulletin, Direct Cooling Technique For Quartz Deposition Monitors, vol. 34, No. 7B Dec. 1991.

(List continued on next page.)

*Primary Examiner*—Zeinab El-Arini
(74) *Attorney, Agent, or Firm*—Knobbe, Martens, Olson & Bear, LLP

(57) ABSTRACT

Semiconductor wafers are cleaned using megasonic energy to agitate cleaning fluid applied to the wafer. A source of energy vibrates an elongated probe which transmits the acoustic energy into the fluid. The probe has a solid cleaning rod and a flared or stepped rear base. In one form, the probe is made of one piece, and in another, the rod fits into a socket in the base. This enables a rod to be made of material which is compatible with the cleaning solution, while the base may be of a different material. A heat transfer member acoustically coupled to the probe base and to a transducer conducts heat away from the transducer. A housing for the heat transfer member and the transducer supports those components and provides means for conducting coolant through the housing to control the temperature of the transducer. In another arrangement, an end of the housing is coupled between the transducer and the probe. In one arrangement, fluid is sprayed onto both sides of a wafer while a probe is positioned close to an upper side. In another arrangement, a short probe is positioned with its end face close to the surface of a wafer, and the probe is moved over the wafer as it rotates. The probe may also be positioned through a central hole in a plurality of discs to clean a group of such elements at one time.

13 Claims, 11 Drawing Sheets

U.S. PATENT DOCUMENTS

| | | |
|---|---|---|
| 2,738,173 | 3/1956 | Massa . |
| 2,760,501 | 8/1956 | Gander . |
| 2,802,476 | 8/1957 | Kearney . |
| 2,814,575 | 11/1957 | Lange, Jr. . |
| 2,934,661 | 4/1960 | Chambers . |
| 2,950,725 | 8/1960 | Jacke et al. . |
| 3,077,155 | 2/1963 | Maddock et al. . |
| 3,094,314 | 6/1963 | Kearney et al. . |
| 3,113,761 | 12/1963 | Platzman . |
| 3,114,654 | 12/1963 | Nishiyama et al. . |
| 3,373,752 | 3/1968 | Inoue . |
| 3,401,708 | 9/1968 | Henes . |
| 3,441,754 | 4/1969 | Heny . |
| 3,499,792 | 3/1970 | Veith . |
| 3,596,883 | 8/1971 | Brech . |
| 3,676,963 | 7/1972 | Rice et al. . |
| 3,694,675 | 9/1972 | Loveday . |
| 3,700,937 | 10/1972 | Rissolo . |
| 3,702,519 | 11/1972 | Rice et al. . |
| 3,845,332 | 10/1974 | Last . |
| 3,893,869 | 7/1975 | Mayer et al. . |
| 3,900,162 | 8/1975 | Titus et al. . |
| 3,972,018 | 7/1976 | Erickson . |
| 3,973,760 | 8/1976 | Browning . |
| 4,027,686 | 6/1977 | Shortes et al. . |
| 4,038,786 | 8/1977 | Fong . |
| 4,062,238 | 12/1977 | Herzl . |
| 4,111,546 | 9/1978 | Maret . |
| 4,178,188 | 12/1979 | Dusssault et al. . |
| 4,183,011 | 1/1980 | Massa . |
| 4,326,553 | 4/1982 | Hall . |
| 4,373,944 | 2/1983 | Glick et al. . |
| 4,389,820 | 6/1983 | Fong et al. . |
| 4,401,131 | 8/1983 | Lawson . |
| 4,402,458 | 9/1983 | Lierke et al. . |
| 4,461,651 | 7/1984 | Hall . |
| 4,489,740 | 12/1984 | Rattan et al. . |
| 4,537,511 | 8/1985 | Frei . |
| 4,543,130 | 9/1985 | Shwartzman . |
| 4,565,942 | 1/1986 | Sakai et al. . |
| 4,579,000 | 4/1986 | Sudo . |
| 4,591,485 | 5/1986 | Olsen et al. . |
| 4,631,250 | 12/1986 | Hayashi . |
| 4,635,655 | 1/1987 | Daley et al. . |
| 4,655,847 | 4/1987 | Ichinoseki et al. . |
| 4,691,725 | 9/1987 | Parisi . |
| 4,694,527 | 9/1987 | Yoshizawa . |
| 4,744,181 | 5/1988 | Moore et al. . |
| 4,747,421 | 5/1988 | Hayashi . |
| 4,804,007 | 2/1989 | Bran . |
| 4,805,171 | 2/1989 | Whitlock et al. . |
| 4,823,041 | 4/1989 | Inoue et al. . |
| 4,857,113 | 8/1989 | Hodge . |
| 4,863,561 | 9/1989 | Freeman et al. . |
| 4,869,278 | 9/1989 | Bran . |
| 4,902,350 | 2/1990 | Steck . |
| 4,917,123 | 4/1990 | McConnell et al. . |
| 4,932,168 | 6/1990 | Tada et al. . |
| 4,936,922 | 6/1990 | Cherry . |
| 4,971,920 | 11/1990 | Miyashita et al. . |
| 4,974,375 | 12/1990 | Tada et al. . |
| 4,978,067 | 12/1990 | Berger et al. . |
| 4,980,300 | 12/1990 | Miyashita et al. . |
| 4,997,490 | 3/1991 | Vetter et al. . |
| 4,998,549 | 3/1991 | Bran . |
| 5,001,084 | 3/1991 | Kawai et al. . |
| 5,013,366 | 5/1991 | Jackson et al. . |
| 5,017,236 | 5/1991 | Moxness et al. . |
| 5,025,597 | 6/1991 | Tada et al. . |
| 5,035,750 | 7/1991 | Tada et al. . |
| 5,037,481 | 8/1991 | Bran . |
| 5,062,898 | 11/1991 | McDermott et al. . |
| 5,071,776 | 12/1991 | Matsushita et al. . |
| 5,090,432 | 2/1992 | Bran . |
| 5,119,840 | 6/1992 | Shibata . |
| 5,125,979 | 6/1992 | Swain et al. . |
| 5,129,956 | 7/1992 | Pickering et al. . |
| 5,147,466 | 9/1992 | Ohmori et al. . |
| 5,247,954 | 9/1993 | Grant et al. . |
| 5,259,890 | 11/1993 | Goff . |
| 5,279,316 | 1/1994 | Miranda . |
| 5,286,657 | 2/1994 | Bran . |
| 5,316,591 | 5/1994 | Chao et al. . |
| 5,348,552 | 9/1994 | Nakajima et al. . |
| 5,364,474 | 11/1994 | Williford, Jr. . |
| 5,365,960 | 11/1994 | Bran . |
| 5,534,076 | 7/1996 | Bran . |
| 5,721,463 | 2/1998 | Snyder . |

OTHER PUBLICATIONS $CO_2$ Snow/Pellet Cleaning/Super Critical Fluid *Precision Cleaning*: Dec. 1995: Vol. lll. No. 11, p. 48.

Robert Sherman; John Grob and Walter Whitlock; Dry Surface Cleaning Using Co'Snow : *Journal Of Vacuum Science & Technology B. Second Series*, vol. 9, No. 4, Jul./Aug. 1991; pp. 1970–1977.

Wayne T. McDermott, Richard C. Ockovic, Jin Jwang Wu and Robert J. Miller; Removing Submicron Surface Particles Using A Cryogenic Argon–Aerosol Technique: *Microcontamination*: Oct. 1991; pp. 33–35 and 94–95.

International Search Report for corresponding PCT Application No. PCT/US97/11812 dated Nov. 10, 1997.

10 MHz Ultrasonic Silicon Cleaning Tool IBM Technical Disclosure Bulletin, vol. 37, No.40. 6A, p. 585, Jun. 1, 1997.

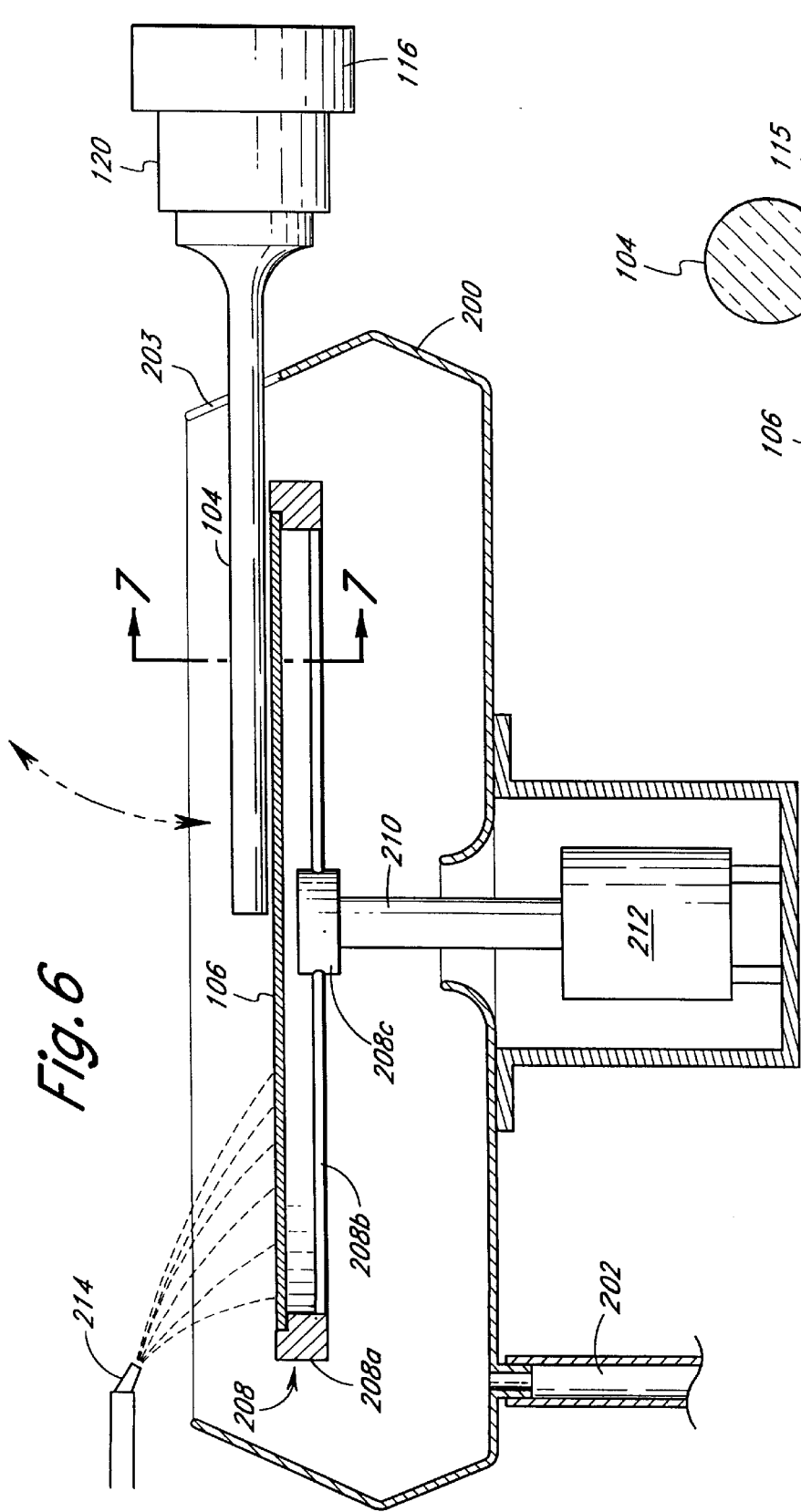

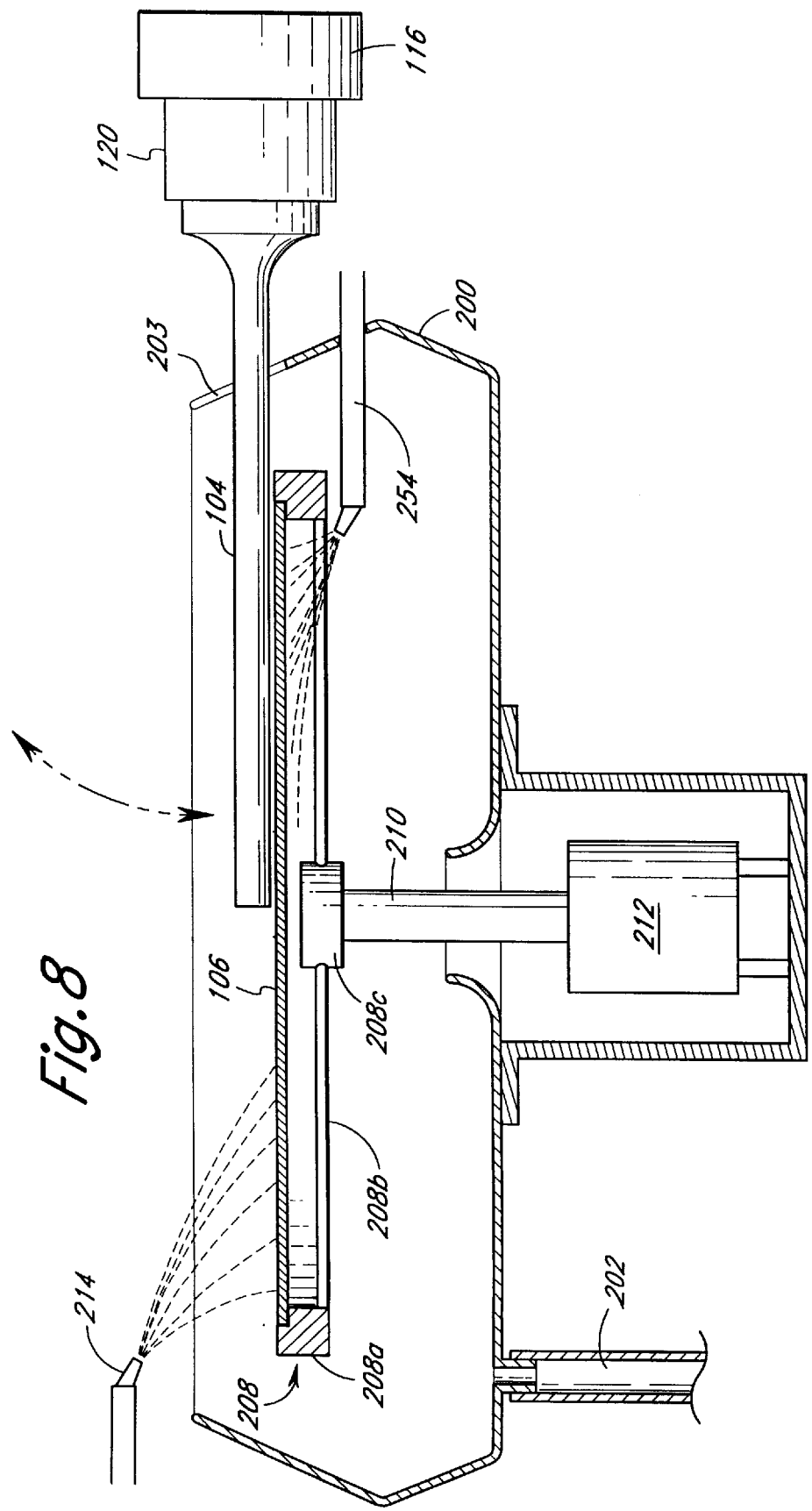

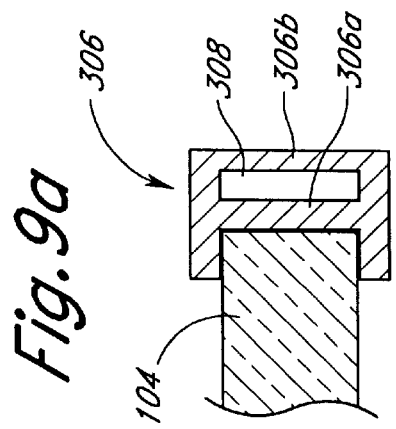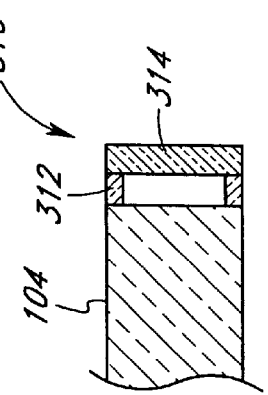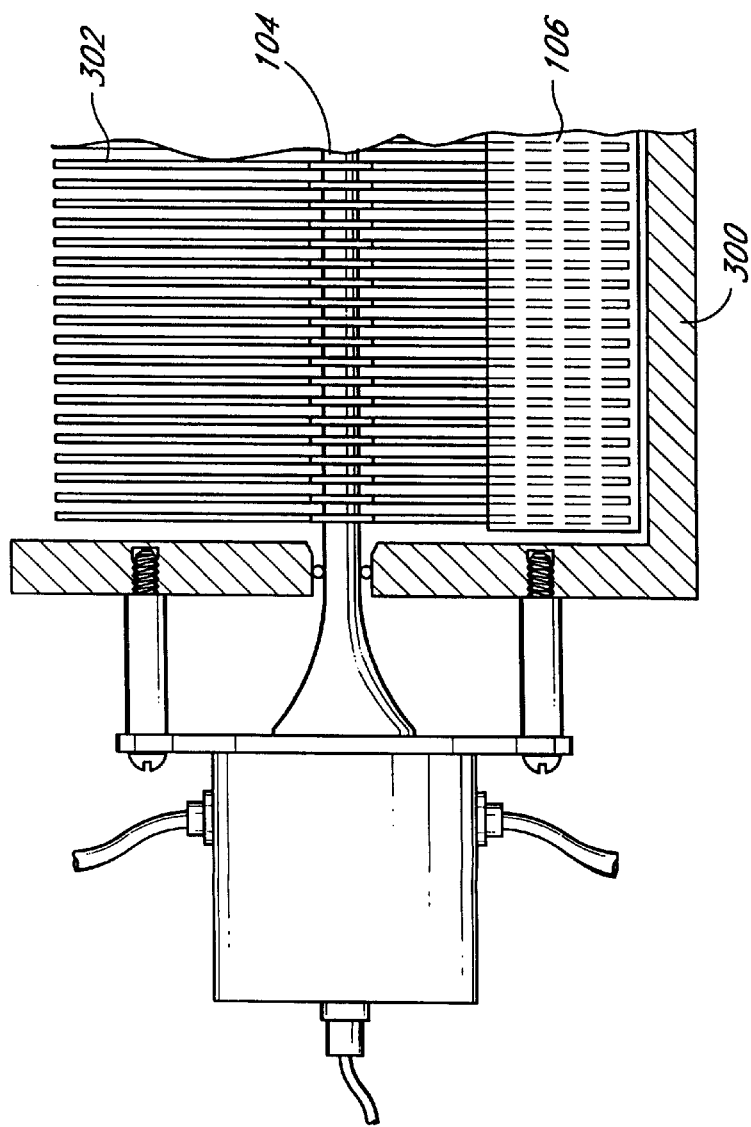

WAFER CLEANING METHOD

RELATED APPLICATIONS

This application is a continuation of U.S. application Ser. No. 09/057,182, filed Apr. 8, 1998, now U.S. Pat. No. 6,140,744, issued Oct. 31, 2000, which is a continuation-in-part of U.S. application Ser. No. 08/724,518 filed Sep. 30, 1996, now U.S. Pat. No. 6,039,059, issued Mar. 21, 2000.

FIELD OF THE INVENTION

This invention relates to an apparatus and method for cleaning semiconductor wafers or other such items requiring extremely high levels of cleanliness.

BACKGROUND OF THE INVENTION

Semiconductor wafers are frequently cleaned in cleaning solution into which megasonic energy is propagated. Megasonic cleaning systems, which operate at a frequency over twenty times higher than ultrasonic, safely and effectively remove particles from materials without the negative side effects associated with ultrasonic cleaning.

Megasonic energy cleaning apparatuses typically comprise a piezoelectric transducer coupled to a transmitter. The transducer is electrically excited such that it vibrates, and the transmitter transmits high frequency energy into liquid in a processing tank. The agitation of the cleaning fluid produced by the megasonic energy loosens particles on the semiconductor wafers. Contaminants are thus vibrated away from the surfaces of the wafer. In one arrangement, fluid enters the wet processing container from the bottom of the tank and overflows the container at the top. Contaminants may thus be removed from the tank through the overflow of the fluid and by quickly dumping the fluid.

A gas impingement and suction cleaning process for electrostatographic reproducing apparatuses which utilizes ultrasonic energy and air under pressure is disclosed in U.S. Pat. No. 4,111,546, issued to Maret.

A process for cleaning by cavitation in liquefied gas is disclosed in U.S. Pat. No. 5,316,591, issued to Chao et al. Undesired material is removed from a substrate by introducing a liquefied gas into a cleaning chamber and exposing the liquefied gas to cavitation-producing means. The shape of the horn to provide the cavitation is not disclosed in detail and does not concentrate the sonic agitation to a particular location within the cleaning vessel.

In U.S. Pat. No. 4,537,511, issued to Frei, an elongated metal tube in a tank of cleaning fluid is energized in the longitudinal wave mode by a transducer that extends through a wall of the tank and is attached to the end of the tube. In order to compensate for relatively high internal losses, the radiating arrangement uses a relatively thin-walled tubular member.

A need exists for an improved apparatus and method which can be used to clean semiconductor wafers.

SUMMARY OF THE INVENTION

The above-referenced parent patent application claims various forms of the invention. The present application is directed to additional embodiments of the invention. This includes a housing having an end wall with a vibrator or transducer, such as a piezoelectric transducer coupled to an interior surface of the end wall, while an elongated probe has an end coupled to an exterior surface of the housing end wall. The transducer when energized propagates megasonic energy through the housing end wall and into the probe. The housing is preferably made of aluminum of other material having good thermal conductivity so that heat generated by the transducer is dissipated through the housing.

A liquid coolant passage is formed in heat transfer relation with the housing. Preferably, this is accomplished by positioning a heat transfer member in the housing in a manner to form the passage in combination with an interior wall of the housing. Coolant is then conducted through this passage to provide the desired cooling effect. The transducer is sealed from the liquid coolant, but nitrogen or other gas may be conducted into the housing, preferably through the heat transfer member, to provide gaseous cooling for the transducer.

Preferably, the probe is coupled to the housing by positioning a layer of viscous material between the housing end wall and the probe and pressing the probe against the housing end wall. The pressing force is provided by compressing a spring against the probe with a spring retainer plate which is clamped to the housing. In addition, an O-ring surrounds the interface between the probe and the housing end wall to confine the viscous material and to center the probe, and is clamped in position by a retaining ring mounted to the housing end wall.

A significant advantage of this embodiment is that the housing end wall through which the vibrational energy is transmitted is much thinner than the heat transfer member which is positioned between the probe and the transducer in the other embodiments. This reduced mass allows increased energy to be transmitted to the probe with the same electrical input. The thin wall has fewer internal reflections of energy and makes tuning the transducer easier. Nevertheless, approximately the same cooling capacity is provided with a housing and a heat transfer member having a size comparable to that of the other embodiments.

In another embodiment, a thin wall of a heat transfer member is sandwiched between the transducer and the probe. Surrounding the thin wall is an elongated annular wall of the heat transfer member, which in turn fits snugly within a surrounding cylindrical housing. A channel formed in the exterior surface of the annular wall of the heat transfer member forms a coolant passage in combination with the housing. An O-ring surrounding the base of the probe is held in position by a retaining ring fastened to the end of the housing. Since the base or rear of the probe extends into the housing, the retainer ring includes a cylindrical portion that extends into the housing to engage the O-ring. An advantage of this embodiment of the invention is that the megasonic energy can be efficiently transmitted by the transducer through the thin wall of the heat transfer member into the probe, while at the same time providing excellent cooling characteristics because of a direct path from the transducer through the heat transfer member to the cooling fluid passage.

Another aspect of the invention that applies to all the embodiments discussed above, as well as those in the parent application, is a probe made of a base having a socket formed therein for receiving an elongated rod portion preferably having a constant cross-section. The base and rod are coupled in a manner to efficiently transmit the megasonic energy from the base to the rod. An advantage of this arrangement is that a single base can be used for rods of different materials and lengths which are to be contacted by a cleaning fluid. For example, a quartz base may be used for many applications, while a rod of different material may be used with a solution containing hydrofluoric acid, which is not compatible with quartz. Also, some materials such as vitreous carbon can withstand most cleaning solutions but the material is presently only readily available in constant diameter rod form.

BRIEF DESCRIPTION OF THE DRAWINGS

FIG. 6 is a schematic view of the probe of the present invention used with cleaning fluid being sprayed onto the upper surface of a wafer.

FIG. 7 is a cross-sectional view on line 7—7 of FIG. 6.

FIG. 8 is a schematic view of the probe cleaning both surfaces of a wafer.

FIG. 9 is a schematic view of the probe of FIG. 1 extending through discs to be cleaned.

FIG. 9a is a fragmentary, cross sectional view of a cap for a probe tip.

FIG. 9b is a fragmentary, cross sectional view of another probe tip cap.

DETAILED DESCRIPTION OF THE PREFERRED EMBODIMENT

Figure 1:
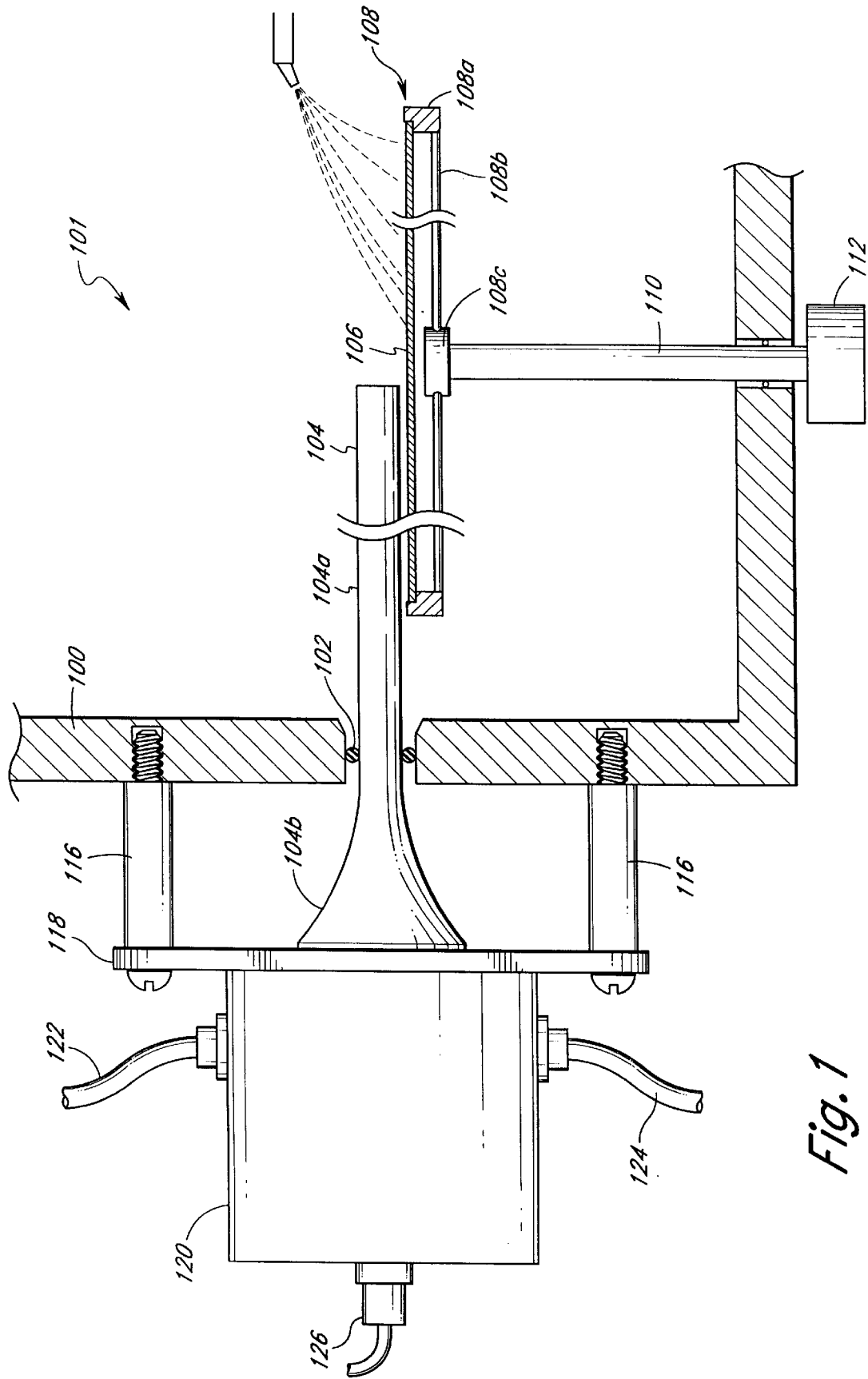
FIG. 1 is a side elevational view of one embodiment of the megasonic energy cleaning system of the present invention.
Figure 2:
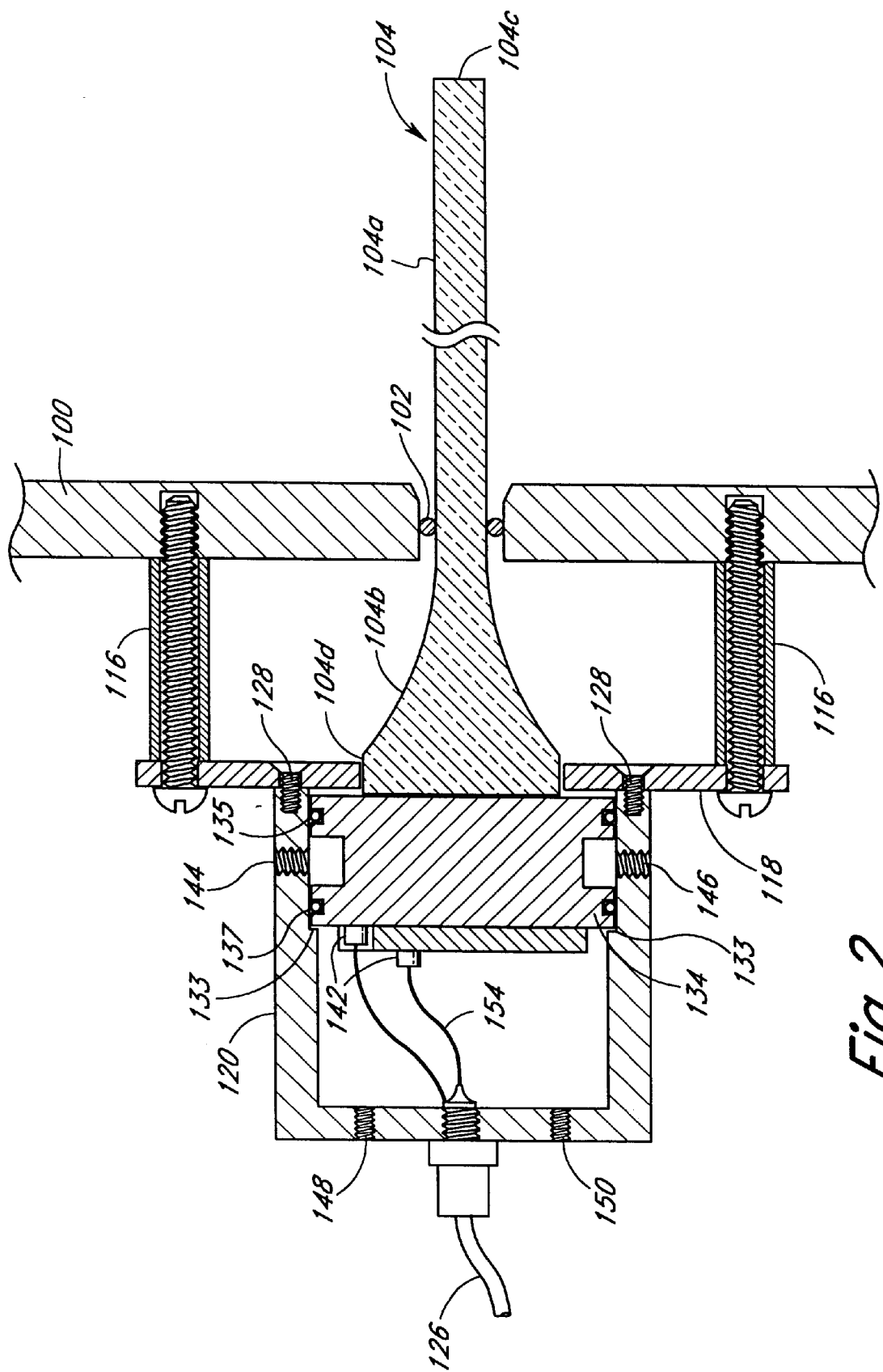
FIG. 2 is a side cross-sectional view of the system shown in FIG. 1.
Figure 3:
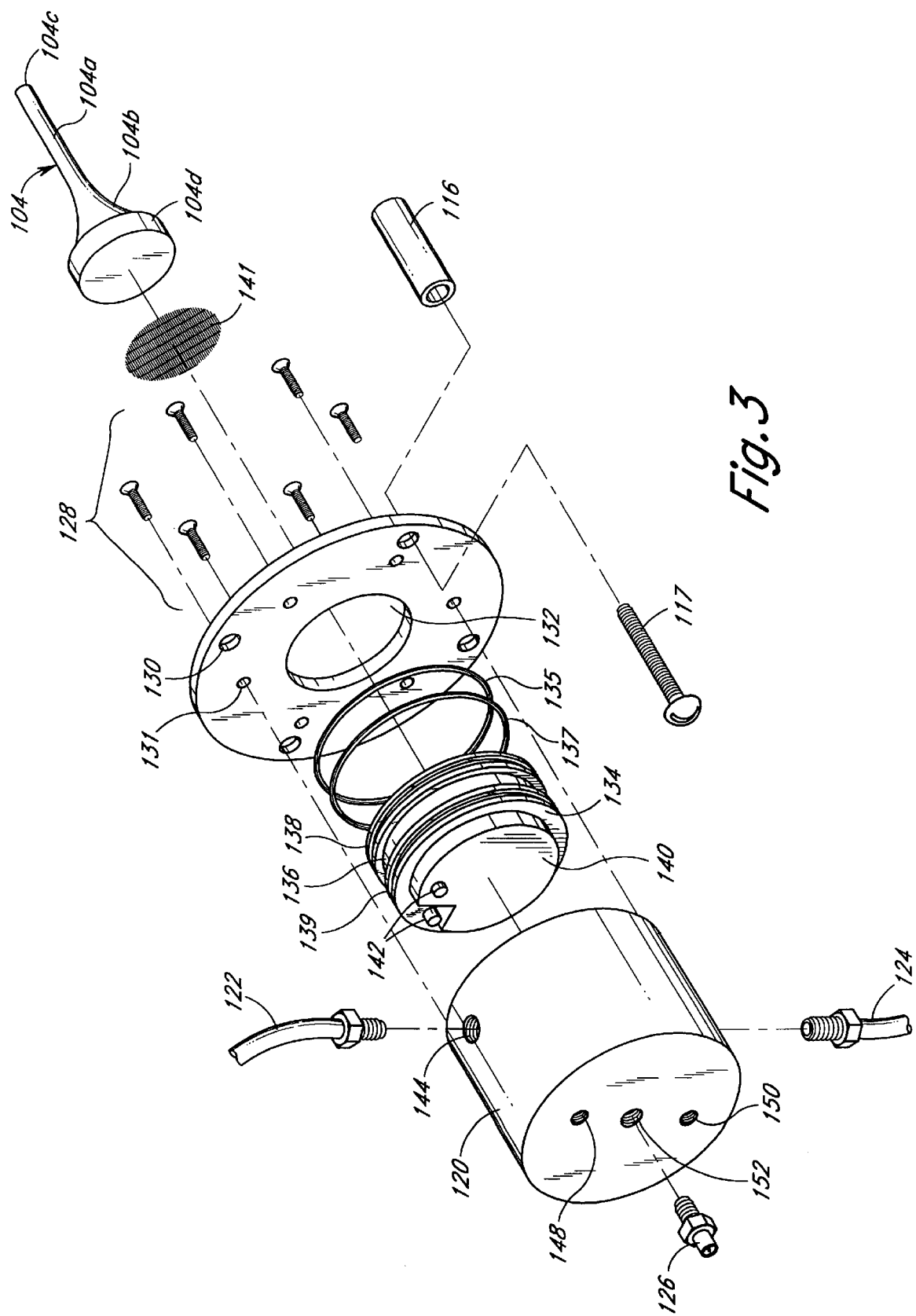
FIG. 3 is an exploded perspective view of the probe assembly shown in FIG. 1.

FIGS. 1–3 illustrate a megasonic energy cleaning apparatus made in accordance with the present invention with an elongated probe 104 inserted through the wall 100 of a processing tank 101. As seen, the probe is supported in cantilever fashion on one end exterior of the container. A suitable O-ring 102, sandwiched between the probe 104 and the tank wall, provides a proper seal for the processing tank 101. A heat transfer member 134, contained within a housing 120, is acoustically and mechanically coupled to the probe 104. Also contained within the housing 120 is a piezoelectric transducer 140 acoustically coupled to the heat transfer member 134. Electrical connectors 142, 154, and 126 are connected between the transducer 140 and a source of acoustic energy (not shown).

The housing supports an inlet conduit 124 and an outlet conduit 122 for coolant and has an opening 152 for electrical connectors. The housing is closed by an annular plate 118 with an opening 132 for the probe. The plate in turn is attached to the tank.

Within the processing tank 101, a support or susceptor 108 is positioned parallel to and in close proximity to the probe 104. The susceptor 108 may take various forms, the arrangement illustrated including an outer rim 108a supported by a plurality of spokes 108b connected to a hub 108c supported on a shaft 110, which extends through a bottom wall of the processing tank 101. Outside the tank 101, the shaft 110 is connected to a motor 112.

The elongated probe 104 is preferably made of a relatively inert, non-contaminating material, such as quartz, which efficiently transmits acoustic energy. While utilizing a quartz probe is satisfactory for most cleaning solutions, solutions containing hydrofluoric acid can etch quartz. Thus, a probe made of sapphire silicon carbide, boron nitride, vitreous carbon, glassy carbon coated graphite, or other suitable materials may be employed instead of quartz. Also, quartz may be coated by a material that can withstand HF such as silicon carbide or vitreous carbon.

The probe 104 comprises a solid, elongated, constant cross-section spindle-like or rod-like cleaning portion 104a, and a base or rear portion 104b. The cross-section of the probe is preferably round and advantageously, the diameter of the cleaning portion of the probe is smaller in diameter than the rear portion of the probe. In a prototype arrangement the area of the rear face of the rear portion 104b is 25 times that of the tip face of portion 104a. Of course, cross-sectional shapes other than circular may be employed.

A cylindrically-shaped rod portion 104a having a small diameter is desirable to concentrate the megasonic energy along the length of the rod 104a. The diameter of the probe, however, should be sufficient to withstand mechanical vibration produced by the megasonic energy transmitted by the probe. Preferably, the radius of the rod portion 104b should be equal to or smaller than the wavelength of the frequency of the energy applied to it. This structure produces a desired standing surface wave action which directs energy radially into liquid contacting the rod. In a prototype, the radius of the cylindrical portion of the probe contained within the tank was approximately 0.2 of an inch and operated at a wave length of about 0.28 of an inch. This produced 3 to 4 wave lengths per inch along the rod length and has provided good results.

The probe cleaning portion 104a should be long enough so that the entire surface area of the wafer is exposed to the probe during wafer cleaning. In a preferred embodiment, because the wafer is rotated beneath the probe, the length of the cleaning portion 104b should be long enough to reach at least the center of the wafer. Therefore, as the wafer is rotated beneath the probe, the entire surface area of the wafer is close to the probe. Actually, the probe could probably function satisfactorily even if it does not reach the center of the wafer since megasonic vibration from the probe tip would provide some agitation towards the wafer center.

The length of the probe is also determined by a predetermined number of wavelengths usually in increments of half wavelengths of the energy applied to the probe. In one embodiment, the length of the probe cleaning portion 104a equals nineteen wavelengths of the applied energy. Due to variations in transducers, it is necessary to tune the transducer to obtain the desired wavelength, so that it works at its most efficient point.

The rear probe portion 104b, which is positioned exterior the tank, flares to a diameter larger than the diameter of the cleaning portion 104a. In a first embodiment of the present invention, shown in FIGS. 1–3, the diameter of the cross-section of the rear portion of the probe gradually increases to a cylindrical section 104d. The large surface area at the end of the rear portion 104d is advantageous for transmitting a large amount of megasonic energy which is then concentrated in the smaller diameter section 104a.

Figure 4:
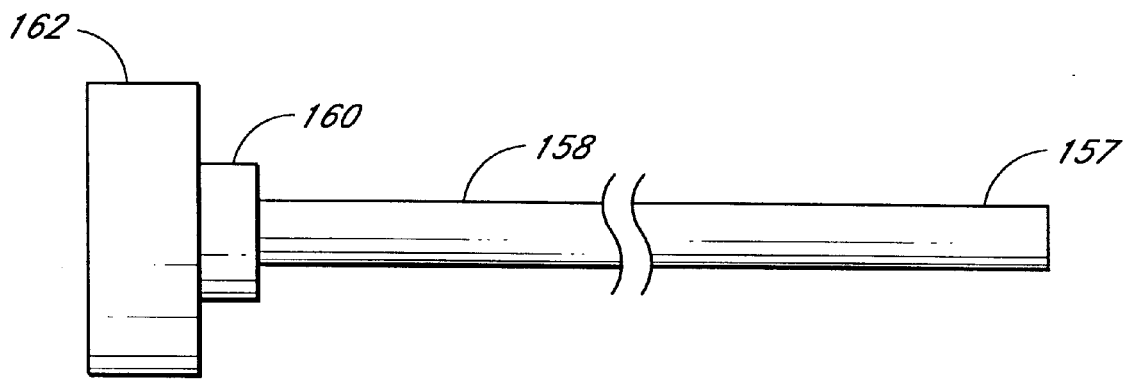
FIG. 4 is a side view of an alternative probe in accordance with the present invention.

As illustrated in FIG. 4, in an alternative embodiment of the present invention, the diameter of the cross-section of the rear portion of the probe increases in stepped increments, rather than gradually. The stepped increments occur at wavelength multiples to efficiently transmit the megasonic energy. For example, in one embodiment, the thinnest portion 158 of the probe has a length of approximately nineteen wavelengths, the next larger diameter portion 160 is about three wavelengths in axial length and the largest diameter portion 162 is about four wavelengths in axial length. The goal is to simulate the results obtained with the tapered arrangement of FIG. 1.

Figure 5A:
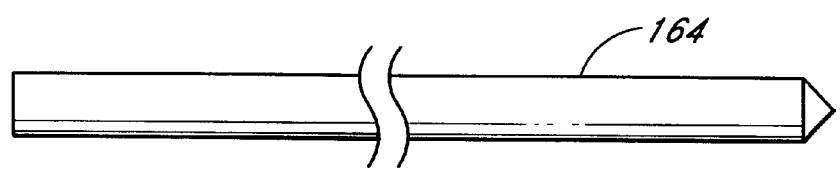
FIGS. 5a–5c are alternative probe tips which may be used in connection with the present invention.
Figure 5B:
Figure 5C:

FIGS. 5a–5c depict further embodiments for the tip of the probe. The different probe tips may help cover a portion of the wafer surface that otherwise would not be covered by a flat probe end 157. The probe may have a conical tip 164, an inverted conical tip 166, or a rounded tip 168.

The probe base 104d is acoustically coupled to a heat transfer member 134 and is physically supported by that member. The probe end face is preferably bonded or glued to the support by a suitable adhesive material. In addition to the bonding material, a thin metal screen 141, shown in FIG. 3, is sandwiched between the probe end and the member 134. The screen with its small holes filled with adhesive provides a more permanent vibration connection than that obtained with the adhesive by itself. The screen utilized in a prototype arrangement was of the expanded metal type, only about 0.002 inch thick with flattened strands defining pockets between strands capturing the adhesive. The adhesive employed was purchased from E.V. Roberts in Los Angeles and formed by a resin identified as number 5000, and a hardener identified as number 61. The screen material is sold by a U.S. company, Delkar. The probe can possibly be clamped or otherwise coupled to the heat transfer member so long as the probe is adequately physically supported and megasonic energy is efficiently transmitted to the probe.

As another alternative, the screen 141 may be made of a berylium copper, only about 0.001 inch thick, made by various companies using chemical milling-processes. One available screen holes for confining the resin that are larger than that of the Delkar .

The heat transfer member 134 is made of aluminum, or some other good conductor of heat and megasonic energy. In the arrangement illustrated, the heat transfer member is cylindrical and has an annular groove 136, which serves as a coolant duct large enough to provide an adequate amount of coolant to suitably cool, the apparatus. Smaller annular grooves 138, 139 on both sides of the coolant groove 136 are fitted with suitable seals, such as O-rings 135, 137 to isolate the coolant and prevent it from interfering with the electrical connections to the transducer 140.

The transducer 140 is bonded, glued, or otherwise acoustically coupled to the rear flat surface of the heat transfer member 134. A suitable bonding material is that identified as ECF 550, available from Ablestick of Gardena, Calif. The transducer 140 is preferably disc shaped and has a diameter larger than the diameter of the rear end of the probe section 104d to maximize transfer of acoustic energy from the transducer to the probe. The heat transfer member is preferably gold-plated to prevent oxidizing of the aluminum and, hence, provide better bonding to the transducer and the probe. The member 134 should have an axial thickness that is approximately equal to an even number of wave lengths or half wave lengths of the energy to be applied to the probe.

The transducer 140 and the heat transfer member 134 are both contained within the housing 120 that is preferably cylindrical in shape. The heat transfer member is captured within an annular recess 133 in an inner wall of the housing 120.

The housing is preferably made of aluminum to facilitate heat transfer to the coolant. The housing has openings 144 and 146 for the outlet 122 and the inlet conduit 124 for the liquid coolant. On its closed end, the housing 134 has an opening 152 for the electrical connections 126 and 154. Openings 148, 150 allow a gaseous purge to enter and exit the housing 120.

An open end of the housing 120 is attached to the annular plate 118 having the central opening 132 through which extends the probe rear section 104d. The annular plate has an outer diameter extending beyond the housing 120 and has a plurality of holes organized in two rings through an inner ring of holes 131, a plurality of connectors 128, such as screws, extend to attach the plate 118 to the housing 120. The annular plate 118 is mounted to the tank wall 100 by a plurality of threaded fasteners 117 that extend through the outer ring of plate holes 130 and thread into the tank wall 100. The fasteners also extend through sleeves or spacers 116 that space the plate 118 from the tank wall. The spacers position the transducer and flared rear portion 104b of the probe outside the tank so that only the cleaning portion of the probe and the probe tip extend into the tank. Also, the spacers isolate the plate 118 and the housing from the tank somewhat, so that vibration from the heat transfer member, the housing and the plate to the wall is minimized.

The processing tank 101 is made of material that does not contaminate the wafer. The tank should have an inlet (not shown) for introducing fluid into the tank and an outlet (not shown) to carry away particles removed from the article.

As the size of semiconductor wafers increases, rather than cleaning a cassette of wafers at once, it is more practical and less expensive to use a cleaning apparatus and method that cleans a single wafer at a time. Advantageously, the size of the probe of the present invention may vary in length depending on the size of the wafer to be cleaned.

A semiconductor wafer 106 or other article to be cleaned is placed on the support 108 within the tank 101. The wafer is positioned sufficiently close to the probe so that the agitation of the fluid between the probe and the wafer loosens particles on the surface of the wafer. Preferably, the distance between the probe and surface of the wafer is no greater than about 0.1 of an inch.

The motor 112 rotates the support 108 beneath the probe 104 so that the entire upper surface of the article is sufficiently close to the vibrating probe 104 to remove particles from the surface of the article. To obtain the necessary relative movement between the probe and the wafer 106, an arrangement could be provided wherein the wafer is moved transversely beneath the probe. Also, an arrangement could be provided wherein the support 108 remains in place while a probe moves above the surface of the wafer 106.

When the piezoelectric transducer 140 is electrically excited, it vibrates at a high frequency. Preferably the transducer is energized at megasonic frequencies with the desired wattage consistent with the probe size length and work to be performed. The vibration is transmitted through the heat transfer member 134 and to the elongated probe 104. The probe 104 then transmits the high frequency energy into cleaning fluid between the probe and the wafer. One of the significant advantages of the arrangement is that the large rear portion of the probe can accommodate a large transducer, and the smaller forward probe portion concentrates the megasonic vibration into a small area so as to maximize particle loosening capability. Sufficient fluid substance between the probe and the wafer will effectively transmit the energy across the small gap between the probe and the wafer to produce the desired cleaning. As the surface area of the wafer 106 comes within close proximity to the probe 104, the agitation of the fluid between the probe 104 and the wafer 106 loosens particles on the semiconductor wafer 106. Contaminants are thus vibrated away from the surfaces of the wafer 106. The loosened particles may be carried away by a continued flow of fluid.

Applying significant wattage to the transducer 140 generates considerable heat, which could present damage to the transducer 140. Therefore, coolant is pumped through the housing 120 to cool the member 134 and, hence, the transducer.

A first coolant, preferably a liquid such as water, is introduced into one side of the housing 120, circulates around the heat transfer member 134 and exits the opposite end of the housing 120. Because the heat transfer member 134 is made of a good thermal conductor, significant quantities of heat may be easily conducted away by the liquid coolant. The rate of cooling can, of course, be readily monitored by changing the flow rate and/or temperature of the coolant.

A second, optional coolant circulates over the transducer by entering and exiting the housing 120 through openings 148, 150 on the closed end of the housing. Due to the presence of the transducer 140 and the electrical wiring 142, 154, an inert gas such as nitrogen is used as a coolant or as a purging gas in this portion of the housing.

Figure 11:
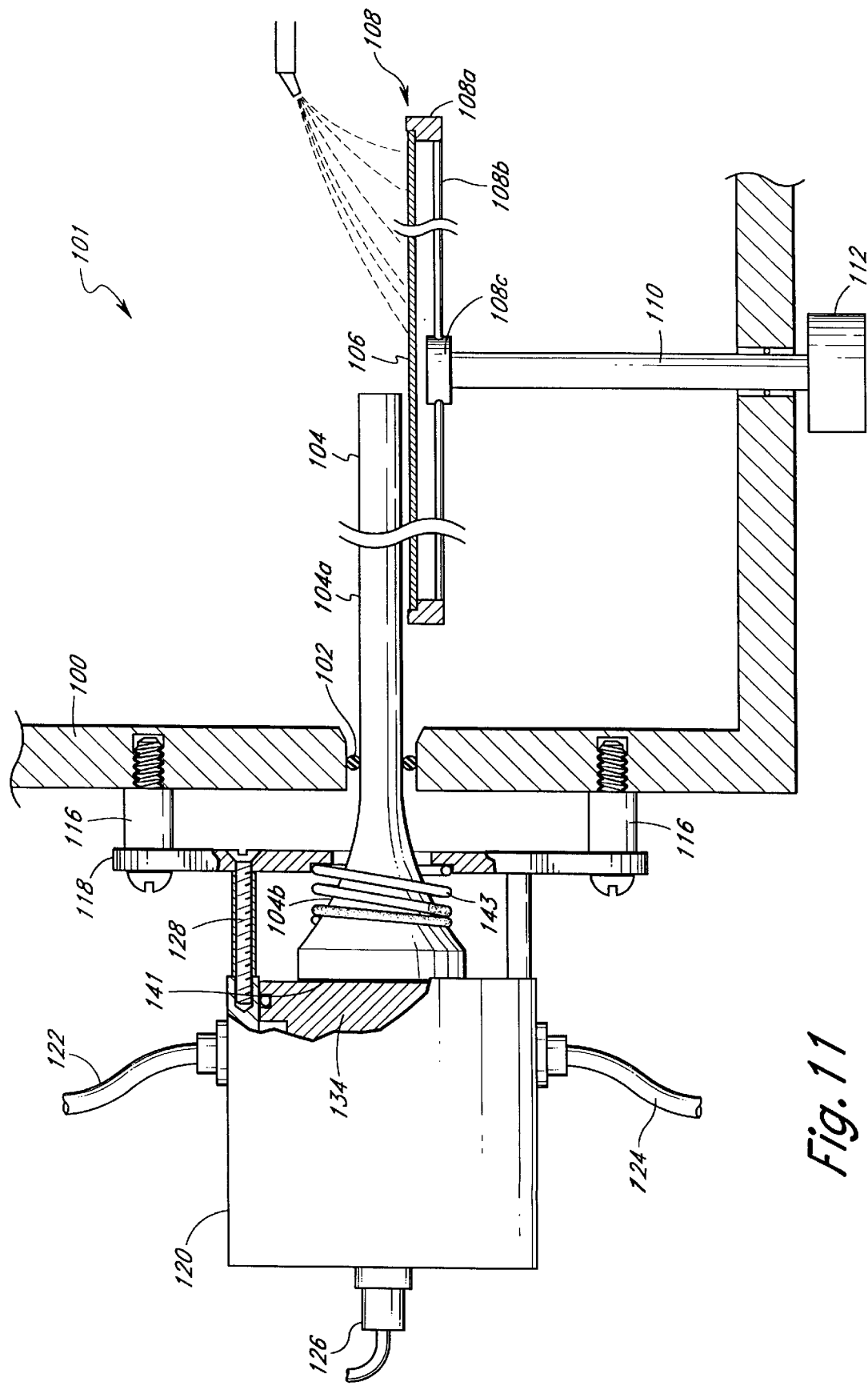
FIG. 11 a side elevational, partially sectionalized view of another embodiment of the invention having an alternate means of coupling the probe to a support.

An alternative arrangement for coupling the probe end 104b to the member 134 is illustrated in FIG. 11. Instead of having the probe bonded to the member 134, a so-called vacuum grease is applied to the screen 141, and the probe is pressed against the member 134 by a coil spring 143. Vacuum grease is a viscous grease which can withstand pressures on opposite sides of a joint without leaking or being readily displaced. In a prototype arrangement, the combination of the grease and the metal spring provided a reliable acoustic coupling. As may be seen in FIG. 11, the housing 120 instead of being mounted directly to the plate 118, is mounted by standoffs 16 to the plate 118. The sleeves 116 and the fasteners 117 are shorter than that shown in FIG. 2, such that the plate 118 surrounds the tapered portion of the probe. This leaves a gap between the housing 120 and the plate 118. The coil spring 143 is positioned in this gap and compressed between the plate 118 and the tapered portion of the probe. Thus, the spring presses the probe toward the member 134. This arrangement acoustically couples the probe to the heat transfer member 134. A Teflon sleeve 149 is preferably positioned over the first coil of the spring 143 adjacent the probe so that the metal spring does not damage the quartz probe.

An arrangement is illustrated in FIG. 6, wherein the probe assembly of FIG. 1 is shown in conjunction with a tank 200 which is open on its upper end and has a drain line 202 in its lower end. The probe 104 is shown extending through a slot 203 into the tank above a wafer 106 mounted on a suitable support 208 including an annular rim 208a, a plurality of spokes 208b, joined to a hub 208c positioned on the upper end of a shaft 210 rotated by a motor 212.

In use, deionized water or other cleaning solution is sprayed onto the upper surface of the wafer from a nozzle 214 while the probe 104 is being acoustically energized. The liquid creates a meniscus 115 between the lower portion of the probe and the adjacent upper surface of the rotating wafer. This is schematically illustrated in FIG. 7. The liquid provides a medium through which the megasonic energy is transmitted to the surface of the wafer to loosen particles. These loosened particles are flushed away by the continuously flowing spray and the rotating wafer. When the liquid flow is interrupted, a certain amount of drying action is obtained through centrifical force of the liquid off of the water.

The probe assembly may be conveniently mounted on a suitable support, schematically illustrated at 216. The support is capable of pivoting the assembly upwardly, as indicated by the arrow in FIG. 6, to facilitate the installation and removal of wafers. Alternatively, the slot 203 may instead be formed as a hole, closed at the top, and the probe may be moved radially in and out.

FIG. 8 illustrates an alternative or addition to the arrangement of FIG. 7 wherein both the lower and upper sides of a wafer are cleaned. A spray nozzle 254 extends through a side wall of a tank 200 and is angled upwardly slightly so that cleaning fluid may be sprayed between the spokes 208b and onto the lower surface of a wafer 106 and is directed radially inwardly so that as the wafer rotates, the entire lower surface is sprayed with the fluid. The wafer is subjected to megasonic energy by the probe 104 in the same manner as described above in connection with FIG. 6. This agitation vibrates the wafer as well as the fluid on the lower surface of the wafer which is radially aligned with the probe as the wafer rotates. This agitation loosens particles on the lower surface of the wafer, and the particles are flushed away with the fluid which falls or drips from the lower surface of the wafer.

Various fluids may be employed as the spray applied to the wafer in FIGS. 6 and 8. In addition to liquid or high pressure gas, so-called dry ice snow may be applied. Va-Tran Systems, Inc. of Chula Vista, Calif. markets a product under the trademark SNO GUN for producing and applying such material. A major advantage of that approach is that there is no disposal problem after cleaning.

Contamination is carried away from the clean surface in a stream of inert, harmless vapor. Disposal costs of cleaning media are eliminated. Advertising literature regarding the SNO GUN product states that cleaning with dry ice snow removes particles more thoroughly than blowing with dry nitrogen. It is said that the device removes even sub-micron particles as tiny as 0.2 microns, which are difficult or impossible to remove with a nitrogen jet. Such technology is further described in U.S. Pat. No. 5,364,474, which is incorporated herein by reference.

Referring to FIG. 9, the probe assembly of FIG. 1 is shown mounted to a wall of a tank 300. The probe 104 extends generally horizontally through central openings in a plurality of vertically orientated substrates such as "compact discs" 302. The discs may be mounted in a cassette immersed in the tank with the holes in the discs aligned with the probe. The cassette carrying the discs can then be moved laterally so that the probe extends through the holes in the discs, without actually contacting the discs. The tank is filled with liquid, such as deionized water to completely cover the discs. The probe is then vibrated by megasonic energy in the manner described above in connection with FIG. 1. The agitation produced by the probe is transmitted into the cleaning liquid between the discs to loosen particles on the surfaces of the discs. The energy propagates radially outward from the probe such that both sides of each disc are exposed to such energy. Cleaning liquid may be introduced into the container in continuous flow and allowed to overflow the upper end of the container to carry away loosened particles.

Because some megasonic energy will be transmitted through the end of the probe with the probe tip immersed in the liquid, a small cap 306 is positioned on the tip of the probe with the cap containing an air space 308 between two glass walls 306a and 306b, as shown in FIG. 9a. Since megasonic energy does not travel through ambient air to any significant degree, the cap prevents the loss of energy through the end of the probe. An alternative cap 310 shown in FIG. 9b employs a short section of glass tubing 212 attached to the end of the probe. As seen, the outer diameter of the tube is equal to the outer diameter of the probe, and the outer end of the tube spaced from the probe is closed by a disc 314.

Figure 10:
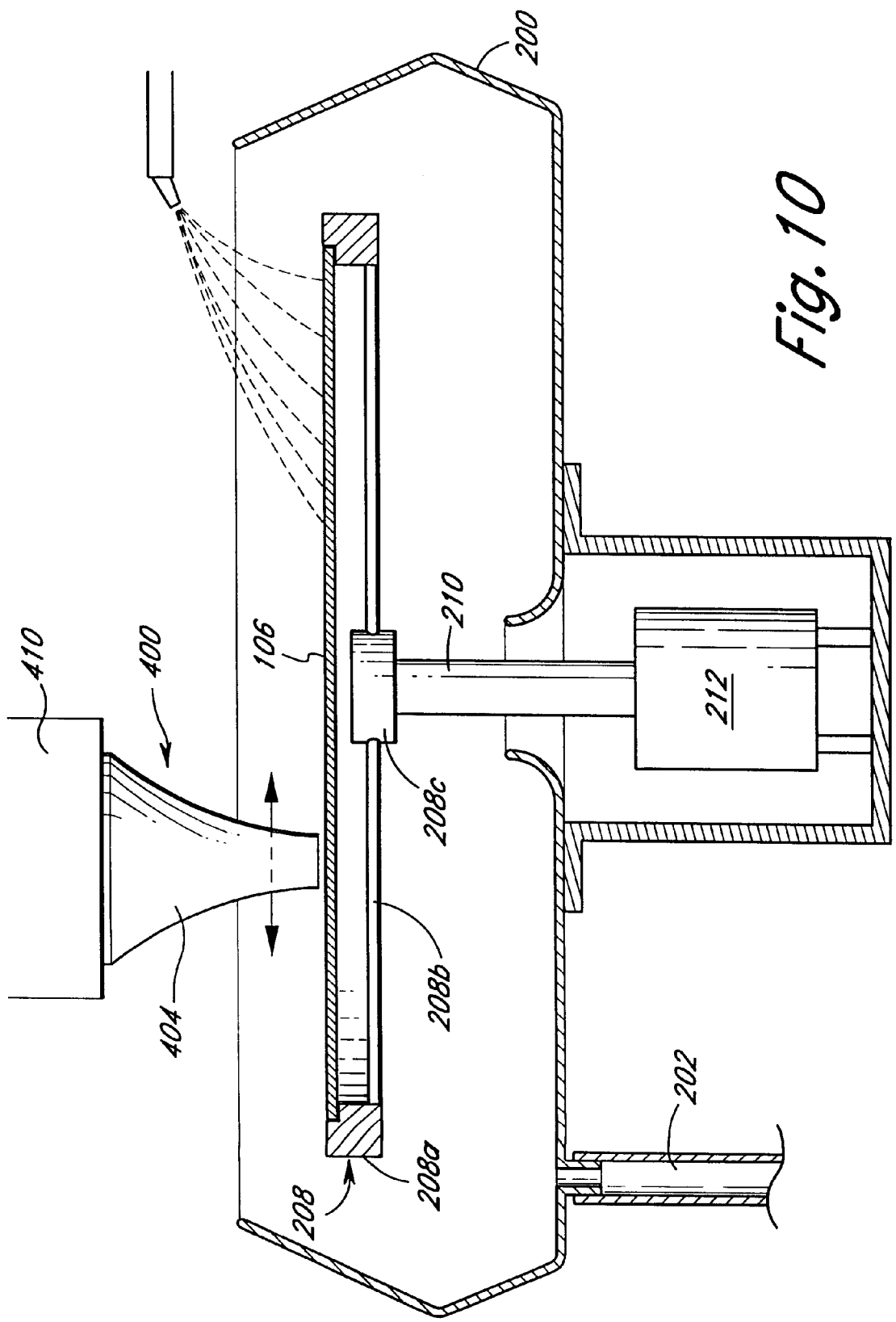
FIG. 10 is a schematic view of a probe vertically oriented with respect to a wafer.

FIG. 10 illustrates another embodiment of the probe of the invention. A probe assembly 400 is shown which is similar to the assembly of FIG. 1 except that the probe 404 is much shorter than the probe 104 in FIG. 1. In addition, the assembly 400 is oriented with the probe extending generally vertically, generally perpendicular to the surface of the horizontal wafer 106. Cleaning fluid is applied to the upper surface of the wafer, and the lower tip of the probe is in contact with this fluid. Consequently, megasonic energy is transmitted through this medium onto the surface of the wafer causing loosening of particles. Since the sides of the probe are not exposed to this medium, there is no appreciable megasonic energy transmitted from the vertical sides of the probe. Instead, such megasonic energy is concentrated into the tip. The tip can be moved radially with respect to the wafer as the wafer rotates so as to apply megasonic energy to the entire surface of the wafer. Alternatively, the probe may traverse the entire upper surface. Any suitable support 410 containing a mechanism to provide the desired movement may be employed.

As mentioned above, the preferred form of the probe assembly includes a probe made of inert material such as quartz and a heat transfer member coupled to the rear of the probe made of a good heat conducting material such as aluminum. Since it is the cylindrical portion of the probe which is in contact with the cleaning fluid and is positioned adjacent the wafer, an alternative arrangement could be devised wherein a forward portion, such as section 104a in FIG. 1 could be made of the inert material and the rear portion 104b could be made of aluminum and hence could be made as one piece with the heat transfer member 134. This of course means that the joint between the two components would be at the rear of the cylindrical portion 104a. While such a bonding area would not be as strong as the arrangement illustrated in FIG. 1, it may be useful in certain situations.

In the other direction, there may be some applications in which it is not necessary to employ quartz or other such inert material for the probe. Instead, the entire probe could be made of aluminum or other such material. In that situation, the heat transfer member could then be made as a one-piece unit with the probe. Also, with a metal probe it may be practical to spray the cleaning fluid through the probe itself. For example in the arrangement of FIG. 10, fluid inlet could be located in the side of the large diameter end of the probe and an outlet can be located in the end face of the small diameter probe end. The fluid would also serve as a coolant to cool the transducer, particularly if dry ice snow were employed.

Figure 12:
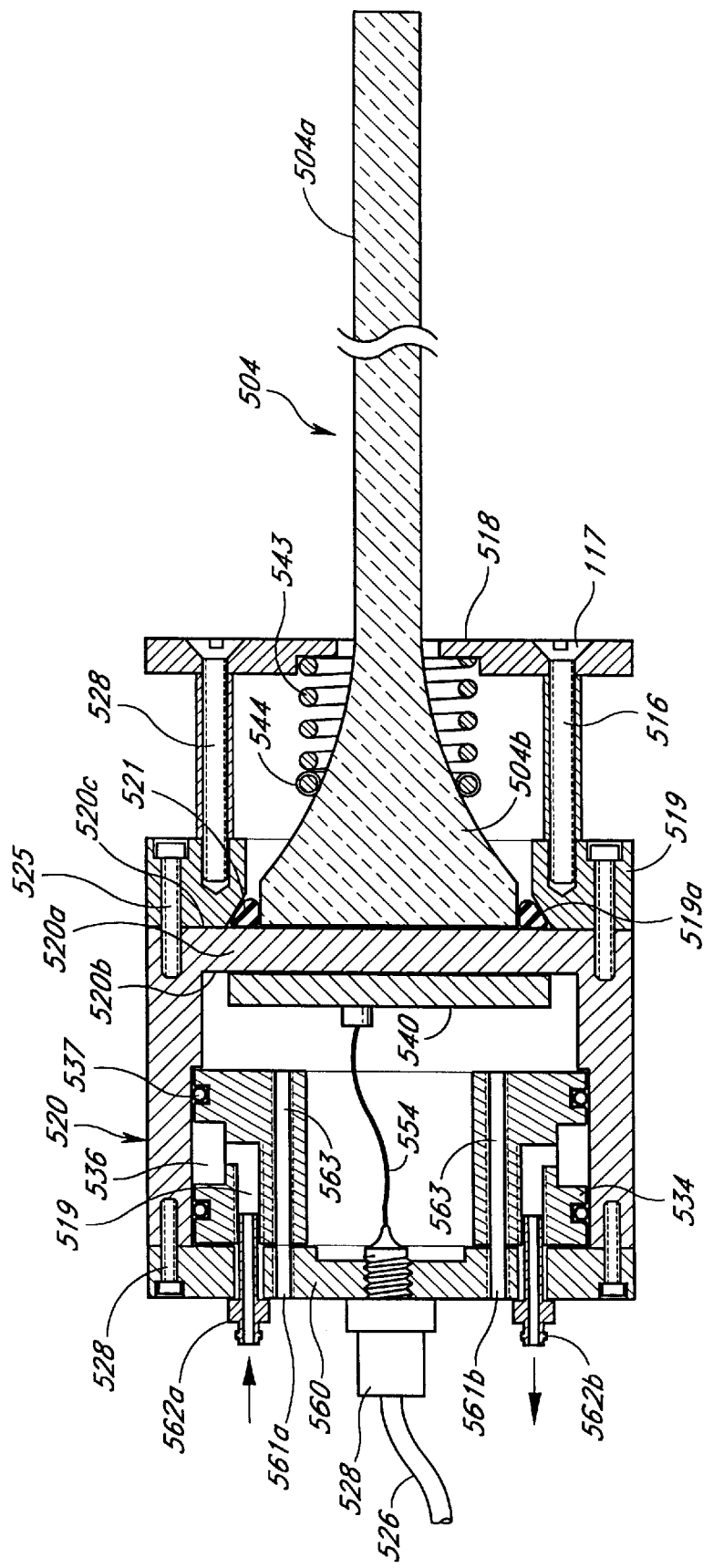
FIG. 12 is a side elevational, partially sectionalized view of another embodiment of the invention having an alternate means of mounting the probe to the housing.

The embodiment of FIG. 12 has a number of similarities to the other embodiments, but has some important distinctions. That arrangement includes a cup-shaped housing 520 similar to the housing 120 in FIG. 2, but inverted with respect to the housing 120. The housing 520 includes a closed end wall 520a having a surface 520b facing the interior of the housing 520 and having an exterior surface 520c facing away from the housing. Coupled to the interior end wall surface 520b is a disc-shaped transducer 540 analogous to the transducer 140 referred to above in connection with FIGS. 2 and 3. The transducer 540 is preferably bonded to the wall surface 520b in the same manner mentioned above in connection with FIGS. 2 and 3.

The large end 504b of a probe 504 is acoustically coupled to the housing end wall exterior surface 520c. The acoustic coupling is accomplished by the use of a coil spring 543 surrounding the probe 504 and reacting against the spring retainer plate 518 to press the large end 504b of the probe towards the housing end wall 520a. As discussed in connection with FIG. 3, a screen 141, together with an appropriate viscous material, is sandwiched between the large end of the probe and the end wall 520a. The coil spring adjacent the large end of the probe has a sleeve or sleeve portions 544 made of a material which will not damage the probe. The O-ring is held in place and compressed against the end wall 520a and the probe by a retainer ring 519 having a surface 519a which presses against the O-ring. The O-ring thus prevents the escape of the viscous material from between the probe and the housing end wall, and centers the probe. The retainer ring is attached to the housing by a plurality of bolts 525 which extend through the retainer ring and thread into the housing. The spring 543 is captured and compressed by a reaction plate 518 which surrounds the probe and is attached to the housing by a plurality of fasteners 528 which thread into the retainer ring 519 and are spaced from it by sleeves 516 surrounding the fasteners 528. For convenience of illustration, the fasteners 525 and 528 are all shown in the same plane in FIG. 12. In actual practice, the fasteners 528 would preferably be on the same bolt hole diameter as the fasteners 525, and they of course would be spaced with respect to the fasteners 525. Also, the fasteners would not necessarily be spaced 180° apart as illustrated, but would be spaced in whatever manner is practical.

Positioned within the cup-shaped housing 520 is an annular heat transfer member 534 which has an external diameter sized to fit snugly within the housing 520. An annular groove 536 in the exterior of the heat transfer member 534, creates a liquid cooling channel in combination with the inner surface of the housing 520. A pair of O-rings 537 that fit within annular grooves in the heat transfer member seal the coolant channel 536 so that the remainder of the interior of the housing is sealed from the liquid. This prevents interference with the electrical energy being supplied to the transducer. Further, transducer vibration energy is not dissipated into the interior of the housing, but instead is transmitted into the housing end wall 520a and into the probe 504. The heat transfer member 534 is axially captured within the housing by means of an annular shoulder 520d and by a housing end plate 560. A plurality of fasteners 528 connect the plate 560 to the housing. A liquid coolant inlet 562a is mounted in an opening in the end plate 560 and threads into a passage 519 in the heat transfer member that extends axially and then radially into the annular channel 536. A similar outlet fitting 562b mounts in the end plate 560 diametrically opposed from the 562a fitting, and threads into another passage 519 that extends axially and radially into the channel 536.

A plurality of axially extending bores 563 are also formed in the heat transfer member 534, aligned with gas inlets 561 formed in the plate 560. The inlets 561 and bores 563 are shown in the same plane with the passages 519 for convenience. In actual practice, the bores 563 would preferably not be in the same plane as the passages 519, and instead would be circumferentially offset, and could also be formed in the same circle around the center of the heat transfer member 534. The inlets 561 through the end plate 560 for the fittings 562a and 562b would likewise be moved to be aligned with the passages 563.

The electrical connection for the transducer 540 is illustrated by the wire 554, although the more complete connection would be as shown in FIG. 3. That wire extends through a fitting 528 which in turn is connected to an electrical cord 526.

In operation, there are a number of advantages to the embodiment illustrated in FIG. 12. By coupling the transducer and the probe to the housing end wall, more energy may be transmitted to the probe than with the corresponding amount of power applied to the transducer in the arrangement of FIG. 2, inasmuch as the housing end wall has less mass than the mass of the heat transfer member 140 shown in FIG. 3. While some energy is lost into the other portions of the housing, there is a net increase in efficiency. The relatively thin end wall has fewer internal energy reflections than a thicker wall simply because of the reduced mass. However, in addition the housing end wall does not have the discontinuities caused by the grooves in the heat transfer member of FIG. 2, or by the O-ring in the grooves.

By making the housing 520 of aluminum or other material which is a relatively good thermal energy conductor, the heat generated by the transducer can be readily dissipated with the arrangement of FIG. 12. The heat transfer member 534 can be made of the desired axial length without concern for its mass because it is not to be vibrated as in the arrangement of FIG. 2. The cooling liquid enters through the fitting 562a, flows axially and then radially into the channel 536, where it splits into two branch flows in opposite directions, that meet on the other side of the heat transfer member and flow out the fitting 562b.

Similarly, cooling gas such as nitrogen can be connected to one or more of the bores 563 in the heat transfer member and into the central area of the housing. The gas is exhausted through one of the bores 563 leading to a second outlet 561b. Two passages 563 are illustrated in FIG. 12. Three are preferable, but more or less may be utilized if desired. To perform an additional function, bolts may be threaded into the bores 563 to assist in withdrawing the heat transfer member from the housing.

The assembly illustrated in FIG. 12 may be used in connection with a wall mounted arrangement such as that shown in FIG. 1, or may be used with a system such as that as illustrated in FIG. 8, wherein the probe assembly is moved into or out of position with respect to a wafer to facilitate insertion and removal of wafers. As mentioned above, such a probe may be moved out of the way by mounting it on a bracket that will pivot it in the direction of the arrow 218 shown in FIG. 8, or it may be on a track arrangement (not shown) which will move it radially inwardly and outwardly with respect to the wafer and its supporting member. The assembly of FIG. 12 may be mounted to these other structures in any suitable fashion, such as by making connections to the end plate 560.

Figure 13:
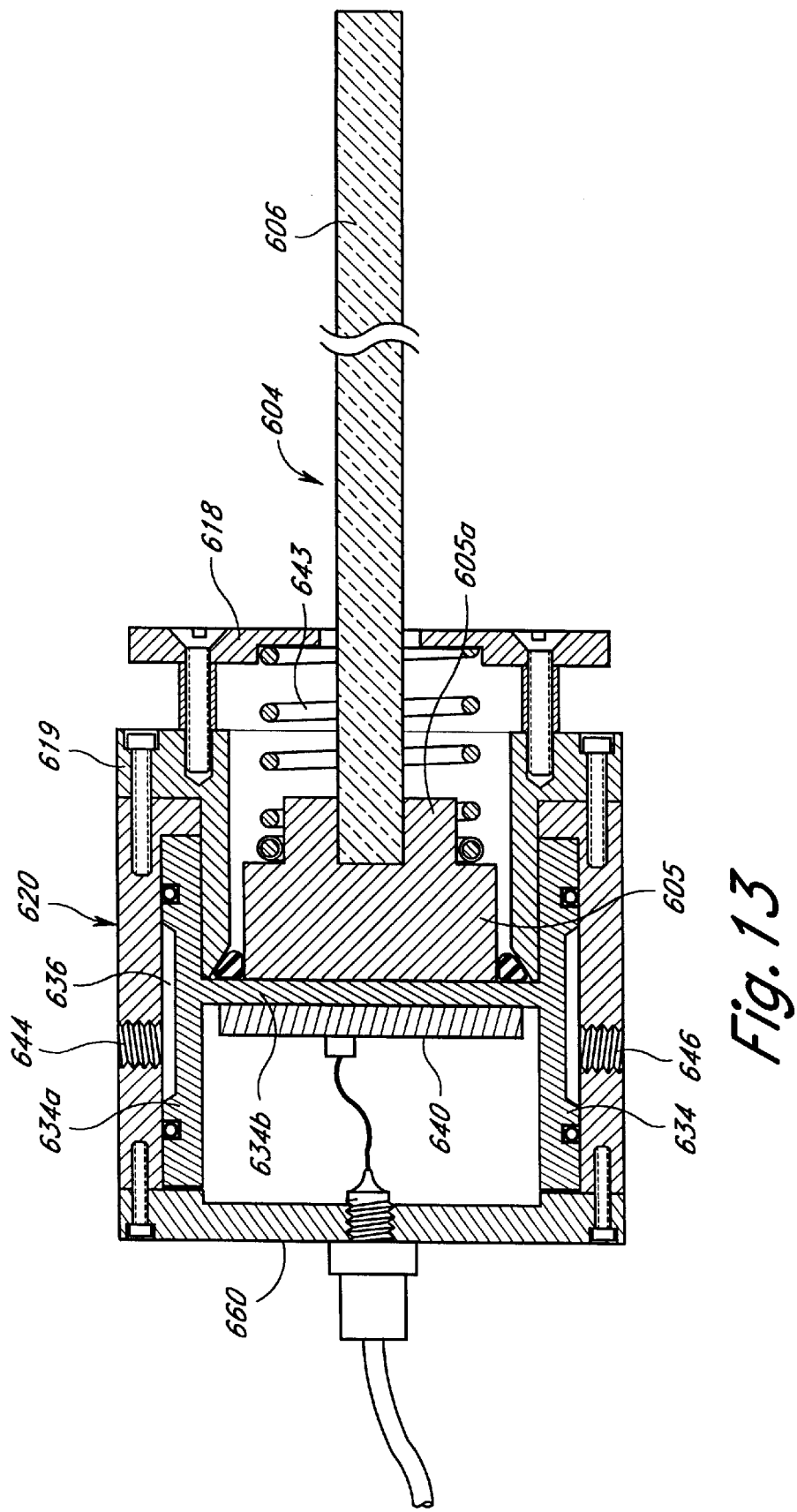
FIG. 13 is a side elevational, partially sectionalized view of another embodiment of the invention having an alternate arrangement for mounting the probe and an alternate probe construction.

The arrangement of FIG. 13 includes a generally tubular or cylindrical housing 620. Positioned within the housing is a heat transfer member 634 having an outer annular wall 634a which fits snugly within a surrounding annular wall of the housing 620. The heat transfer member 634 has an annular channel 636 formed in its outer surface that faces the surrounding housing wall to form a coolant passage. A coolant inlet 644 in the housing wall leads into the passage and an outlet 646 on the opposite side of the housing leads out of the passage.

As seen in FIG. 13, the heat transfer member 634 has somewhat of an H-shaped cross section created by a central disc-shaped wall 634b integrally formed with the surrounding annular wall 634a. As seen, the central wall 634b is relatively thin and it is radially aligned with the surrounding coolant passage 636. The heat transfer member is axially captured within the housing by an internal shoulder on one end of the housing and by an end plate 660 on the other end.

A piezoelectric transducer 640 is acoustically coupled to one side of the central wall 634b, such as in the same manner discussed above in connection with the other embodiments. A probe 604 is acoustically coupled to the other side of the central wall 634b. Again, this may be done in various ways, such as the screen and grease technique discussed above. An O-ring 621 surrounds the base of the probe and is compressed against the probe and the central wall 634b by a cylindrical portion of an end member 619 having a flange attached to the end of the housing 620. The O-ring confines the coupling grease and helps center the probe 604. The probe is pressed against the central wall 634b by a spring 643 compressed between an annular spring retainer plate 18 and the probe 604.

The housing and heat transfer member illustrated in FIG. 13 may be used with the probes illustrated in the above-mentioned embodiments, but it is illustrated in FIG. 13 with an alternate probe construction. Instead of having the probe made of one piece, it is formed in separate portions including a base 605 adjacent the central wall 634b of the heat transfer member, and an elongated cleaning rod 606. The base 605 has a cylindrical exterior with a reduced diameter portion 605a on the end spaced from the central wall 634b. One end of the spring 643 surrounds the base portion 605a and engages the shoulder on the base 605 adjacent the portion 605a. The rod, 606 of the probe fits within a central socket formed in the base 605. It is bonded to the base by a suitable adhesive which will not interfere with the transmission of the megasonic energy provided by the transducer 640 and propagated through the central wall 634b and the base 605 of the probe.

The base 605 can have a frusto-conical configuration just as the rear portion of the probe in FIG. 12, and the spring 643 could then engage the sloping side wall of such shape rather than having the step configuration shown in FIG. 13. Also, in theory, the rod 606 could have a tapered end and the spring could engage it as suggested by FIG. 12.

A primary purpose of having a probe made of two different portions is that one portion can be made of a different material from the other. For example, the base 605 can be utilized in any cleaning operation since it does not contact the cleaning solution; however, the rod 606 must be compatible with the cleaning solution. Thus, if the cleaning solution is compatible with quartz, a one-piece arrangement such as that illustrated in FIG. 1 or FIG. 12 could be conveniently utilized. If, however, the cleaning solution is not compatible with quartz, such as a solution containing hydrofluoric acid, a material for the rod is needed that is compatible, such as vitreous carbon, while the base can be quartz. It is currently difficult to obtain vitreous carbon in a shape such as that illustrated in FIG. 12. However, a straight cylindrical rod is more readily available. Hence, it is practical to utilize it in the arrangement illustrated in FIG. 13. Of course any other desirable combination of suitable materials for the rod and the base may be employed.

As mentioned above, the arrangement of FIG. 13 is particularly desirable from the standpoint that the transmission of megasonic energy is efficient through the thin wall portion of the heat exchange member, but yet the heat exchange process is very efficient. This is because the transducer, which is the heat generator, is in direct contact with the heat transfer member, which is in direct contact with the coolant passage 636. It should be recognized that other heat transfer arrangements may be employed. For example, if the heat transfer member has sufficient surface area, it might be possible to have it air-cooled rather than liquid-cooled. It should also be recognized that various other modifications of that type may be made to the embodiments illustrated without departing from the scope of the invention, and all such changes are intended to fall within the scope of the invention, as defined by the appended claims.

What is claimed is:

1. A method of cleaning an article comprising the steps of:
   positioning the article to be cleaned on a support;
   placing an elongated side of a rod-like probe spaced from but sufficiently close to a substantially flat surface of said article to loosen particles on the surface when said probe vibrates;
   introducing fluid into a small gap between the probe and said surface to create a meniscus of fluid between the probe and said surface;
   vibrating said probe; and
   producing relative movement between said article and said probe to cause the surface of said article to be cleaned to be sufficiently close to said probe to loosen particles on the surface of said article.

2. The method of claim 1, wherein said probe is vibrated by energizing a transducer connected to said probe to oscillate at a predetermined frequency.

3. The method of claim 2, further comprising the step of controlling temperature of said transducer by conducting coolant in heat transfer relation with the probe.

4. The method of claim 3, including controlling said temperature by positioning a heat transfer member between the probe and the transducer, and conducting coolant in contact with the heat transfer member.

5. The method of claim 2, wherein said energizing is performed at megasonic frequencies.

6. The method of claim 1, wherein said fluid introducing step includes spraying dry ice snow on the wafer.

7. The method of claim 1, wherein the steps performed on said article are performed on a semiconductor wafer.

8. The method of claim 1, wherein said vibrating step is performed at megasonic frequencies.

9. A method of cleaning one or more thin disks, comprising:
   positioning said disks in a container in a substantially vertical orientation with a central opening in each of said disks being horizontally aligned to define a substantially horizontal axis;
   inserting an elongated rod-like probe through a wall of said container into said disk openings, said rod being adapted to transmit megasonic energy into liquid within the container; and
   applying megasonic energy to a rear portion of said probe in a manner to cause the probe to vibrate and propagate megasonic energy within the liquid in the container so as to loosen particles on said disks.

10. A method of cleaning a semiconductor wafer comprising:
    supporting the wafer substantially horizontally;
    positioning a probe close to an upper surface of the wafer;
    spraying cleaning fluid onto the upper surface and a lower surface of the wafer so that a fluid coupling is formed between the probe and the upper surface of the wafer; and
    applying megasonic energy to vibrate the probe and loosen particles on the upper and lower wafer surfaces.

11. The method of claim 10, wherein the spraying on the wafer lower surface is approximately aligned with a wafer portion beneath the probe.

12. The method of claim 10, including producing relative movement between the wafer and the probe so that a portion of the upper surface of the wafer to be cleaned is close to the probe.

13. A method of cleaning a semiconductor wafer comprising:
    supporting the wafer substantially horizontally;
    positioning a probe close to an upper surface of the wafer;
    introducing cleaning fluid onto the upper surface and a lower surface of the wafer so that a fluid coupling is formed between the probe and the upper surface of the wafer; and
    applying megasonic energy to vibrate the probe and loosen particles on the upper and lower wafer surfaces.

\* \* \* \* \*